(12) United States Patent
Matsudai et al.

(10) Patent No.: US 12,382,648 B2
(45) Date of Patent: Aug. 5, 2025

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Tomoko Matsudai, Shibuya Tokyo (JP); Yoko Iwakaji, Meguro Tokyo (JP); Hiroko Itokazu, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/631,243

(22) Filed: Apr. 10, 2024

(65) Prior Publication Data

US 2024/0258413 A1    Aug. 1, 2024

Related U.S. Application Data

(63) Continuation of application No. 17/471,079, filed on Sep. 9, 2021, now Pat. No. 11,984,495.

(30) Foreign Application Priority Data

Sep. 16, 2020   (JP) .................................. 2020-155895

(51) Int. Cl.
*H01L 29/739*       (2006.01)
*H03K 17/567*       (2006.01)
(Continued)

(52) U.S. Cl.
CPC ......... *H10D 12/481* (2025.01); *H03K 17/567* (2013.01); *H10D 62/107* (2025.01); *H10D 62/393* (2025.01)

(58) Field of Classification Search
CPC .. H10D 12/481; H10D 62/107; H10D 62/393; H10D 30/0275; H10D 62/364;
(Continued)

(56) References Cited

U.S. PATENT DOCUMENTS 4,980,743 A    12/1990   Nakagawa et al.
8,421,184 B2    4/2013   Koyama et al.
(Continued)

FOREIGN PATENT DOCUMENTS

CN          106537598 A     3/2017
CN          110931551 A     3/2020
(Continued)

OTHER PUBLICATIONS

Notice of Reasons for Refusal (Office Action) mailed Apr. 15, 2025 in Japanese Patent Application No. 2024-117447 with machine translation, 6 pages.

*Primary Examiner* — Cuong B Nguyen
(74) *Attorney, Agent, or Firm* — Kim & Stewart LLP

(57) ABSTRACT

A semiconductor device of embodiments includes: a semiconductor layer having a first face and a second face opposite to the first face and including a first trench, a second trench, and a third trench provided on a first face side; a first gate electrode in the first trench; a second gate electrode in the second trench; a third gate electrode in the third trench; a fourth gate electrode and a fifth gate electrode provided on a second face side; a first electrode contacting the first face; a second electrode contacting the second face; a first electrode pad electrically connected to the first gate electrode; a second electrode pad electrically connected to the second gate electrode; a third electrode pad electrically connected to the third gate electrode; a fourth electrode pad electrically connected to the fourth gate electrode; and a fifth electrode pad electrically connected to the fifth gate electrode.

8 Claims, 7 Drawing Sheets

(51) Int. Cl.
*H10D 12/00* (2025.01)
*H10D 62/10* (2025.01)
*H10D 62/17* (2025.01)

(58) Field of Classification Search
CPC .... H10D 84/611; H03K 17/567; H02K 15/40; H10F 30/283
See application file for complete search history.

(56) References Cited

U.S. PATENT DOCUMENTS

| | | | |
|---|---|---|---|
| 9,324,848 B2 | 4/2016 | Sumitomo et al. |
| 9,515,067 B2 | 12/2016 | Saikaku et al. |
| 11,031,491 B2 | 6/2021 | Satoh |
| 2005/0161768 A1 | 7/2005 | Sugiyama et al. |
| 2014/0209972 A1 | 7/2014 | Sumitomo et al. |
| 2017/0077273 A1 | 3/2017 | Kitagawa |
| 2017/0250260 A1 | 8/2017 | Bina et al. |
| 2017/0250269 A1 | 8/2017 | Sumitomo et al. |
| 2018/0083129 A1 | 3/2018 | Kitagawa |
| 2019/0006495 A1 | 1/2019 | Ogura et al. |
| 2019/0296133 A1 | 9/2019 | Iwakaji et al. |
| 2020/0083879 A1 | 3/2020 | Tanaka et al. |
| 2020/0091323 A1 | 3/2020 | Iwakaji et al. |
| 2020/0091325 A1 | 3/2020 | Matsudai et al. |
| 2020/0091326 A1 | 3/2020 | Iwakaji et al. |
| 2020/0098903 A1 | 3/2020 | Satoh |
| 2020/0303524 A1 | 9/2020 | Matsudai et al. |
| 2020/0303527 A1 | 9/2020 | Matsudai et al. |

FOREIGN PATENT DOCUMENTS

| | | |
|---|---|---|
| CN | 110943125 A | 3/2020 |
| JP | H08-21713 A | 3/1996 |
| JP | 2005-191221 A | 7/2005 |
| JP | 2010-123667 A | 6/2010 |
| JP | 2013-251395 A | 12/2013 |
| JP | 5454073 B2 | 3/2014 |
| JP | 2017-054968 A | 3/2017 |
| JP | 2018-046255 A | 3/2018 |
| JP | 6416062 B2 | 10/2018 |
| JP | 2019-012813 A | 1/2019 |
| JP | 2019-169597 A | 10/2019 |
| JP | 2020-047756 A | 3/2020 |
| JP | 2020-047789 A | 3/2020 |
| JP | 2020-047790 A | 3/2020 |
| JP | 2020-053466 A | 4/2020 |
| JP | 2020-155472 A | 9/2020 |
| JP | 2020-161786 A | 10/2020 |
| WO | 2018/109794 A1 | 6/2018 |

SEMICONDUCTOR DEVICE AND SEMICONDUCTOR CIRCUIT

CROSS-REFERENCE TO RELATED APPLICATION

This application is a continuation of U.S. patent application Ser. No. 17/471,079, filed on Sep. 9, 2021, which is based upon and claims the benefit of priority from Japanese Patent Application No. 2020-155895, filed on Sep. 16, 2020, the entire contents of each of which are incorporated herein by reference.

FIELD

Embodiments described herein relate generally to a semiconductor device and a semiconductor circuit.

BACKGROUND

An example of a power semiconductor device is an insulated gate bipolar transistor (IGBT) having a trench gate structure. In the IGBT having a trench gate structure, for example, a p-type collector region, an n-type drift region, and a p-type base region are provided on a collector electrode. Then, in a trench that penetrates the p-type base region and reaches the n-type drift region, a gate electrode is provided with a gate insulating film interposed therebetween. In addition, an n-type emitter region connected to an emitter electrode is provided in a region adjacent to the trench on the surface of the p-type base region.

In the above IGBT, a channel is formed in the p-type base region by applying a positive voltage higher than a threshold voltage to the gate electrode. Then, electrons are injected from the n-type emitter region into the n-type drift region, and holes are injected from the p-type collector region into the n-type drift region. As a result, an on-current having electrons and holes as carriers flows between the collector electrode and the emitter electrode.

A termination region is provided around a cell region where the trench gate structure is provided. The termination region includes, for example, an electric field relaxation structure such as a guard ring. By providing the termination region, the electric field strength at the end of the cell region is reduced, so that the reduction in breakdown voltage when the IGBT is OFF is suppressed.

At the end of the cell region, carriers spread up to the termination region where there is no cell when the IGBT is ON-state. During the turn-off operation in which the IGBT switches from ON-state to OFF-state, the carriers spread up to the termination region are concentrated and discharged at the end of the cell region. Therefore, current concentration occurs at the end of the cell region. As a result, the IGBT may be damaged due to the current concentration.

DETAILED DESCRIPTION

Figure 1:
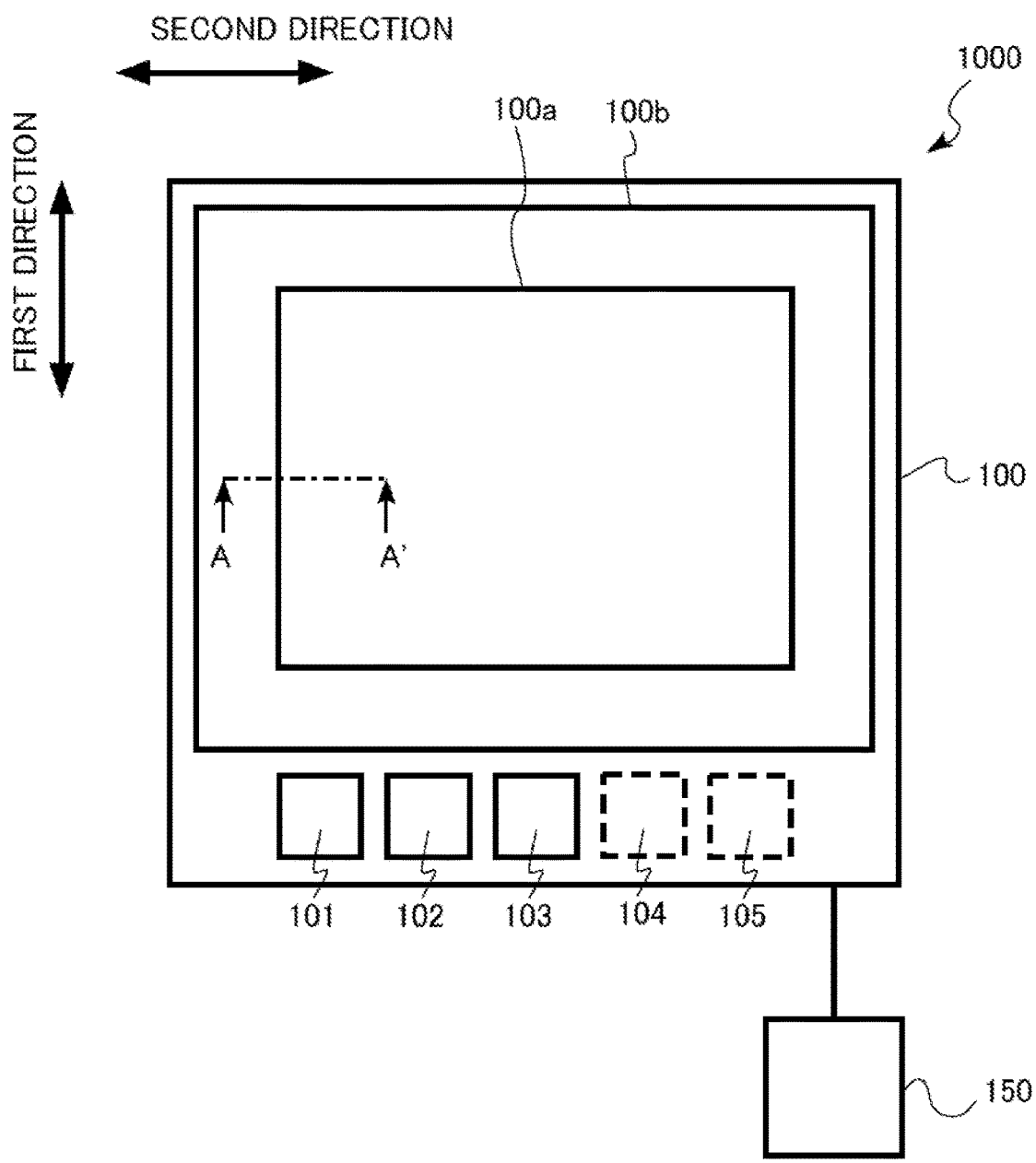
FIG. 1 is a schematic diagram of a semiconductor circuit according to a first embodiment.

A semiconductor device of embodiments includes: a semiconductor layer having a first face and a second face opposite to the first face and including a first trench provided in a first face side, a second trench provided in the first face side, and a third trench provided in the first face side; a first gate electrode provided in the first trench; a second gate electrode provided in the second trench; a third gate electrode provided in the third trench; a fourth gate electrode provided on a second face side of the semiconductor layer; a fifth gate electrode provided on the second face side of the semiconductor layer; a first electrode in contact with the first face; a second electrode in contact with the second face; a first electrode pad electrically connected to the first gate electrode; a second electrode pad electrically connected to the second gate electrode; a third electrode pad electrically connected to the third gate electrode; a fourth electrode pad electrically connected to the fourth gate electrode; and a fifth electrode pad electrically connected to the fifth gate electrode.

Hereinafter, embodiments will be described with reference to the diagrams. In the following description, the same or similar members and the like are denoted by the same reference numerals, and the description of the members and the like once described will be omitted as appropriate.

In this specification, the distribution and absolute value of the impurity concentration in a semiconductor region can be measured by using, for example, secondary ion mass spectrometry (SIMS). In addition, the relative magnitude relationship between the impurity concentrations in two semiconductor regions can be determined by using, for example, scanning capacitance microscopy (SCM). In addition, the distribution and absolute value of the impurity concentration can be measured by using, for example, spreading resistance analysis (SRA). By the SCM and the SRA, the relative magnitude relationship or absolute values of the carrier concentrations in semiconductor regions can be calculated. By assuming the activation rate of impurities, the relative magnitude relationship between the impurity concentrations in two semiconductor regions, the distribution of the impurity concentration, and the absolute value of the impurity concentration can be calculated from the measurement results of the SCM and the SRA.

First Embodiment

A semiconductor device of a first embodiment includes: a semiconductor layer having a first face and a second face opposite to the first face and including a first trench provided on a side of the first face, a second trench provided on the side of the first face, and a third trench provided on the side of the first face; a first gate electrode provided in the first trench; a second gate electrode provided in the second trench; a third gate electrode provided in the third trench; a fourth gate electrode provided on a side of the second face; a fifth gate electrode provided on the side of the second face; a first electrode in contact with the first face; a second electrode in contact with the second face; a first electrode pad electrically connected to the first gate electrode; a second electrode pad electrically connected to the second gate electrode; a third electrode pad electrically connected to the third gate electrode; a fourth electrode pad electrically connected to the fourth gate electrode; and a fifth electrode pad electrically connected to the fifth gate electrode.

In addition, a semiconductor circuit of the first embodiment includes: the semiconductor device described above; and a control circuit for controlling a voltage to be applied to the first electrode pad, the second electrode pad, the third electrode pad, the fourth electrode pad, and the fifth electrode pad.

The semiconductor device of the first embodiment is an IGBT 100 having a double-sided gate structure in which a gate electrode is provided on the surface side and the back surface side of a semiconductor layer. In addition, the IGBT 100 includes three types of gate electrodes that are independently controlled on the surface side of the semiconductor layer. In addition, the IGBT 100 includes two types of gate electrodes that are independently controlled on the back surface side of the semiconductor layer. The gate electrode on the surface side of the semiconductor layer has a trench gate structure provided in the trench. Hereinafter, a case where the first conductive type is an n type and the second conductive type is a p type will be described as an example.

FIG. 1 is a schematic diagram of a semiconductor circuit according to a first embodiment. The semiconductor circuit of the first embodiment is a semiconductor module 1000.

The semiconductor module 1000 includes the IGBT 100 and a control circuit 150.

FIG. 1 shows the layout of the IGBT 100. The IGBT 100 includes a cell region 100a, a termination region 100b, a first surface gate electrode pad 101 (first electrode pad), a second surface gate electrode pad 102 (second electrode pad), a third surface gate electrode pad 103 (third electrode pad), a first back surface gate electrode pad 104 (fourth electrode pad), and a second back surface gate electrode pad 105 (fifth electrode pad).

The termination region 100b surrounds the cell region 100a. The first surface gate electrode pad 101, the second surface gate electrode pad 102, and the third surface gate electrode pad 103 are disposed on the surface side of the IGBT 100. The first back surface gate electrode pad 104 and the second back surface gate electrode pad 105 are disposed on the back surface side of the IGBT 100.

Figure 2:
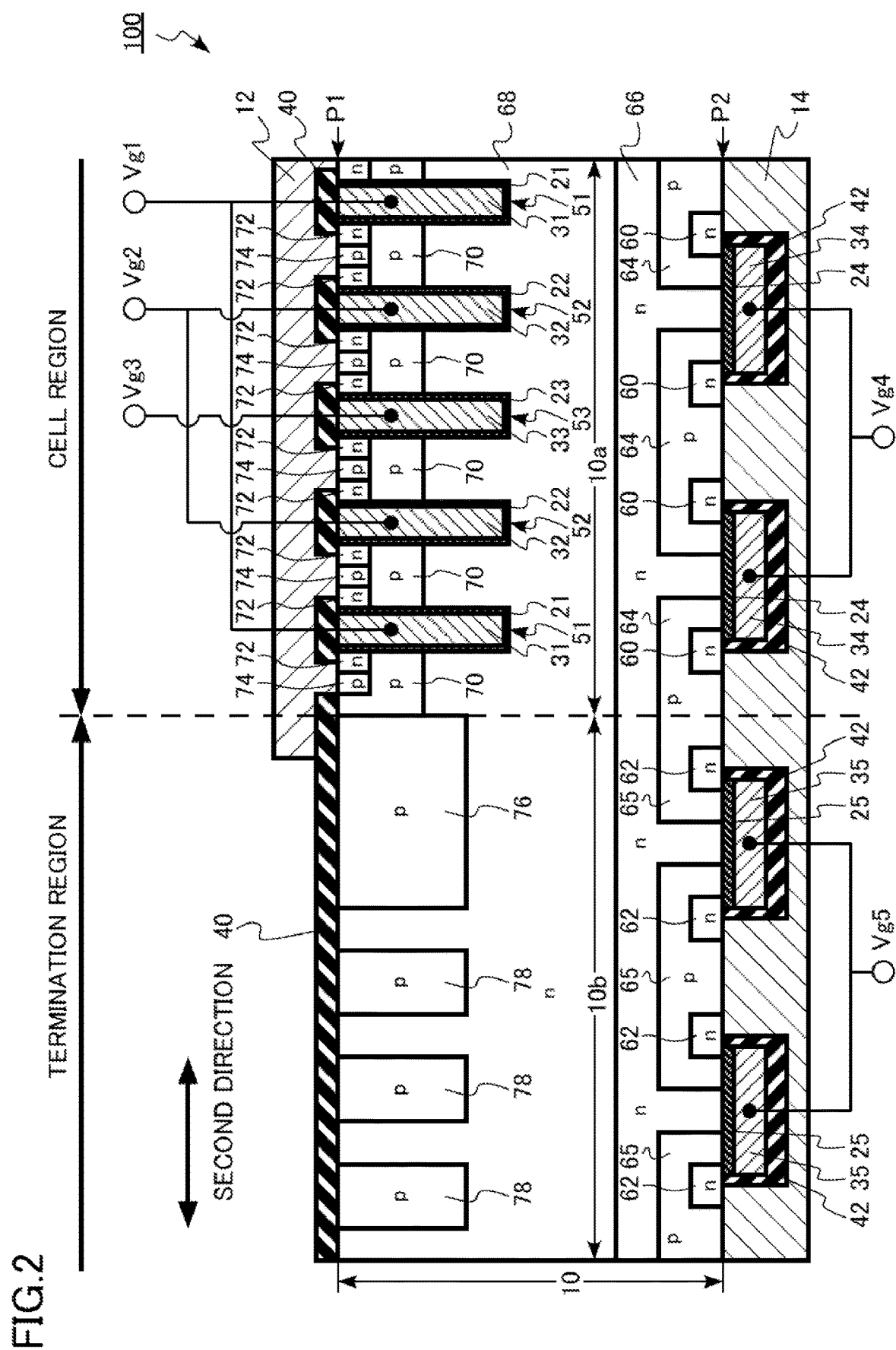
FIG. 2 is a schematic cross-sectional view of a part of a semiconductor device of the first embodiment.

FIG. 2 is a schematic cross-sectional view of a part of the semiconductor device of the first embodiment. FIG. 2 is a cross-sectional view taken along the line AA' of FIG. 1.

The IGBT 100 of the first embodiment includes a semiconductor layer 10, an emitter electrode 12 (first electrode), a collector electrode 14 (second electrode), a first surface gate insulating film 21, a second surface gate insulating film 22, a third surface gate insulating film 23, a first back surface gate insulating film 24, a second back surface gate insulating film 25, a main gate electrode 31 (first gate electrode), a control gate electrode 32 (second gate electrode), a pre-gate electrode 33 (third gate electrode), a back surface cell gate electrode 34 (fourth gate electrode), a back surface termination gate electrode 35 (fifth gate electrode), a surface interlayer insulating layer 40, and a back surface interlayer insulating layer 42.

In the semiconductor layer 10, a main gate trench 51 (first trench), a control gate trench 52 (second trench), a pre-gate trench 53 (third trench), an n-type cell drain region 60 (sixth semiconductor region), an n-type termination drain region 62 (seventh semiconductor region), a p-type cell collector region 64 (fourth semiconductor region), a p-type termination collector region 65 (fifth semiconductor region), an n-type buffer region 66, an n-type drift region 68 (first semiconductor region), a p-type base region 70 (second semiconductor region), an n-type emitter region 72 (third semiconductor region), a p-type contact region 74, a p-type boundary region 76 (eighth semiconductor region), and a p-type guard ring region 78 are provided.

The semiconductor layer 10 has a first face P1 and a second face P2 opposite to the first face P1. The first face P1 is the surface of the semiconductor layer 10, and the second face P2 is the back surface of the semiconductor layer 10.

In this specification, one direction parallel to the first face P1 is referred to as a first direction. In addition, a direction parallel to the first face P1 and perpendicular to the first direction is referred to as a second direction.

The semiconductor layer 10 includes a cell portion 10a and a termination portion 10b. The cell portion 10a is included in the cell region 100a of the semiconductor layer 10. The termination portion 10b is included in the termination region 100b of the semiconductor layer 10. The termination portion 10b surrounds the cell portion 10a.

The semiconductor layer 10 is, for example, single crystal silicon. The thickness of the semiconductor layer 10 is, for example, equal to or more than 40 µm and equal to or less than 700 µm.

The emitter electrode 12 is provided on the first face P1 side of the semiconductor layer 10. At least a part of the emitter electrode 12 is in contact with the first face P1 of the semiconductor layer 10. The emitter electrode 12 is, for example, a metal. An emitter voltage (Ve) is applied to the emitter electrode 12. The emitter voltage is, for example, 0 V.

The collector electrode 14 is provided on the second face P2 side of the semiconductor layer 10. At least a part of the collector electrode 14 is in contact with the second face P2 of the semiconductor layer 10. The collector electrode 14 is, for example, a metal.

A collector voltage (Vc) is applied to the collector electrode 14. The collector voltage is, for example, equal to or more than 200 V and equal to or less than 6500 V.

The main gate trench 51 is provided in the cell region 100a. The main gate trench 51 is provided in the first face P1 side of the cell portion 10a. The main gate trench 51 is a groove provided in the cell portion 10a. The main gate trench 51 extends in the first direction. The main gate trench 51 is repeatedly provided in the second direction.

The control gate trench 52 is provided in the cell region 100a. The control gate trench 52 is provided in the first face P1 side of the cell portion 10a. The control gate trench 52 is a groove provided in the cell portion 10a. The control gate trench 52 extends in the first direction. The control gate trench 52 is repeatedly provided in the second direction.

The pre-gate trench 53 is provided in the cell region 100a. The pre-gate trench 53 is provided in the first face P1 side of the cell portion 10a. The pre-gate trench 53 is a groove provided in the cell portion 10a. The pre-gate trench 53 extends in the first direction. The pre-gate trench 53 is repeatedly provided in the second direction.

The main gate electrode 31 is provided in the cell region 100a. The main gate electrode 31 is provided on the first face P1 side of the cell portion 10a. At least a part of the main gate electrode 31 is provided in the main gate trench 51. The first surface gate electrode pad 101 is electrically connected to the main gate electrode 31 using a wiring (not shown).

The main gate electrode 31 is, for example, polycrystalline silicon containing n-type impurities or p-type impurities. A first gate voltage (Vg1) is applied to the main gate electrode 31. The first gate voltage (Vg1) is a voltage when the emitter voltage (Ve) is a reference voltage.

Hereinafter, a transistor controlled by the first gate voltage (Vg1) applied to the main gate electrode 31 is referred to as a main gate transistor.

The first surface gate insulating film 21 is provided between the main gate electrode 31 and the cell portion 10a. At least a part of the first surface gate insulating film 21 is provided in the main gate trench 51. The first surface gate insulating film 21 is, for example, a silicon oxide film.

The control gate electrode 32 is provided in the cell region 100a. The control gate electrode 32 is provided on the first face P1 side of the cell portion 10a. At least a part of the control gate electrode 32 is provided in the control gate trench 52. The second surface gate electrode pad 102 is electrically connected to the control gate electrode 32 using a wiring (not shown).

The control gate electrode 32 is, for example, polycrystalline silicon containing n-type impurities or p-type impurities. A second gate voltage (Vg2) is applied to the control gate electrode 32. The second gate voltage (Vg2) is a voltage when the emitter voltage (Ve) is a reference voltage.

Hereinafter, a transistor controlled by a second gate voltage (Vg2) applied to the control gate electrode 32 is referred to as a control gate transistor.

The second surface gate insulating film 22 is provided between the control gate electrode 32 and the cell portion 10a. At least a part of the second surface gate insulating film 22 is provided in the control gate trench 52. The second surface gate insulating film 22 is, for example, a silicon oxide film.

The pre-gate electrode 33 is provided in the cell region 100a. The pre-gate electrode 33 is provided on the first face P1 side of the cell portion 10a. At least a part of the pre-gate electrode 33 is provided in the pre-gate trench 53. The third surface gate electrode pad 103 is electrically connected to the pre-gate electrode 33 using a wiring (not shown).

The pre-gate electrode 33 is, for example, polycrystalline silicon containing n-type impurities or p-type impurities. A third gate voltage (Vg3) is applied to the pre-gate electrode 33. The third gate voltage (Vg3) is a voltage when the emitter voltage (Ve) is a reference voltage.

Hereinafter, a transistor controlled by the third gate voltage (Vg3) applied to the pre-gate electrode 33 is referred to as a pre-gate transistor.

The third surface gate insulating film 23 is provided between the pre-gate electrode 33 and the cell portion 10a. At least a part of the third surface gate insulating film 23 is provided in the pre-gate trench 53. The third surface gate insulating film 23 is, for example, a silicon oxide film.

The back surface cell gate electrode 34 is provided in the cell region 100a. The back surface cell gate electrode 34 is provided on the second face P2 side of the cell portion 10a. The first back surface gate electrode pad 104 is electrically connected to the back surface cell gate electrode 34 using a wiring (not shown).

The back surface cell gate electrode 34 is, for example, polycrystalline silicon containing n-type impurities or p-type impurities. A fourth gate voltage (Vg4) is applied to the back surface cell gate electrode 34. The fourth gate voltage (Vg4) is a voltage when the collector voltage (Vc) is a reference voltage.

Hereinafter, a transistor controlled by the fourth gate voltage (Vg4) applied to the back surface cell gate electrode 34 is referred to as a back surface cell gate transistor.

The first back surface gate insulating film 24 is provided between the back surface cell gate electrode 34 and the cell portion 10a. The first back surface gate insulating film 24 is, for example, a silicon oxide film.

The back surface termination gate electrode 35 is provided in the termination region 100b. The back surface termination gate electrode 35 is provided on the second face P2 side of the termination portion 10b. The second back surface gate electrode pad 105 is electrically connected to the back surface termination gate electrode 35 using a wiring (not shown).

The back surface termination gate electrode 35 is, for example, polycrystalline silicon containing n-type impurities or p-type impurities. A fifth gate voltage (Vg5) is applied to the back surface termination gate electrode 35. The fifth gate voltage (Vg5) is a voltage when the collector voltage (Vc) is a reference voltage.

Hereinafter, a transistor controlled by the fifth gate voltage (Vg5) applied to the back surface termination gate electrode 35 is referred to as a back surface termination transistor.

The second back surface gate insulating film 25 is provided between the back surface termination gate electrode 35 and the termination portion 10b. The second back surface gate insulating film 25 is, for example, a silicon oxide film.

Figure 3A:
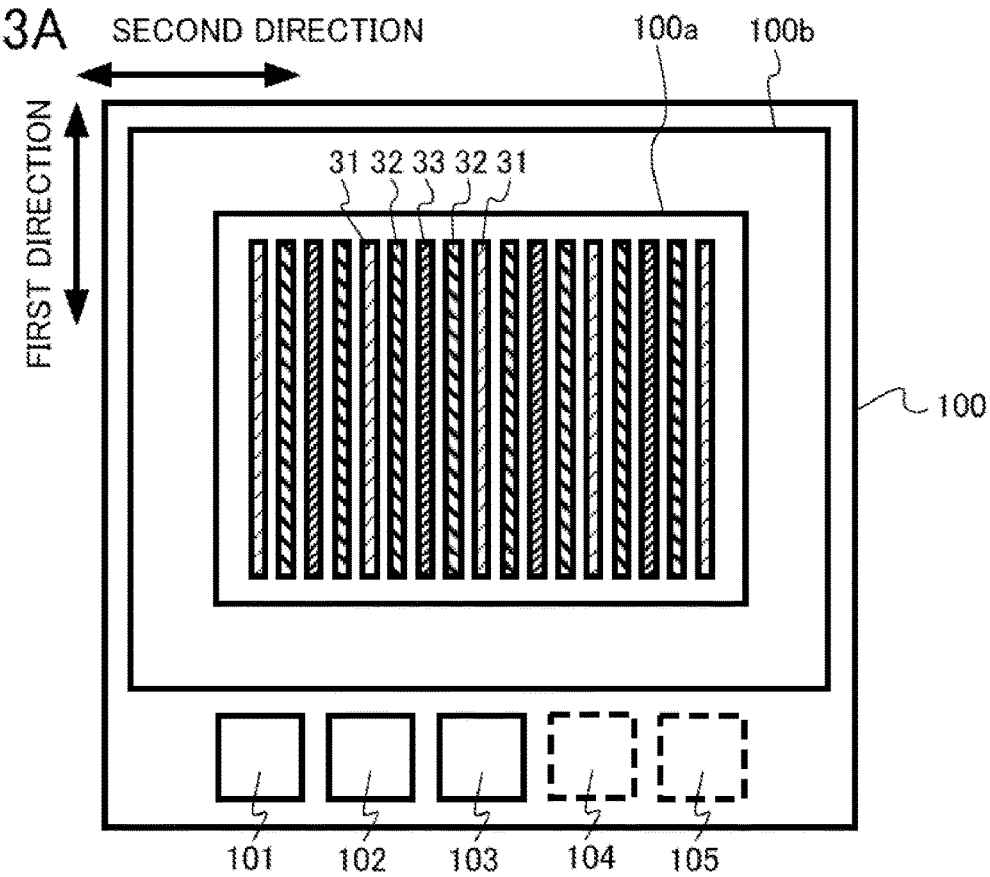
FIGS. 3A and 3B are schematic plan views of the semiconductor device of the first embodiment.
Figure 3B:
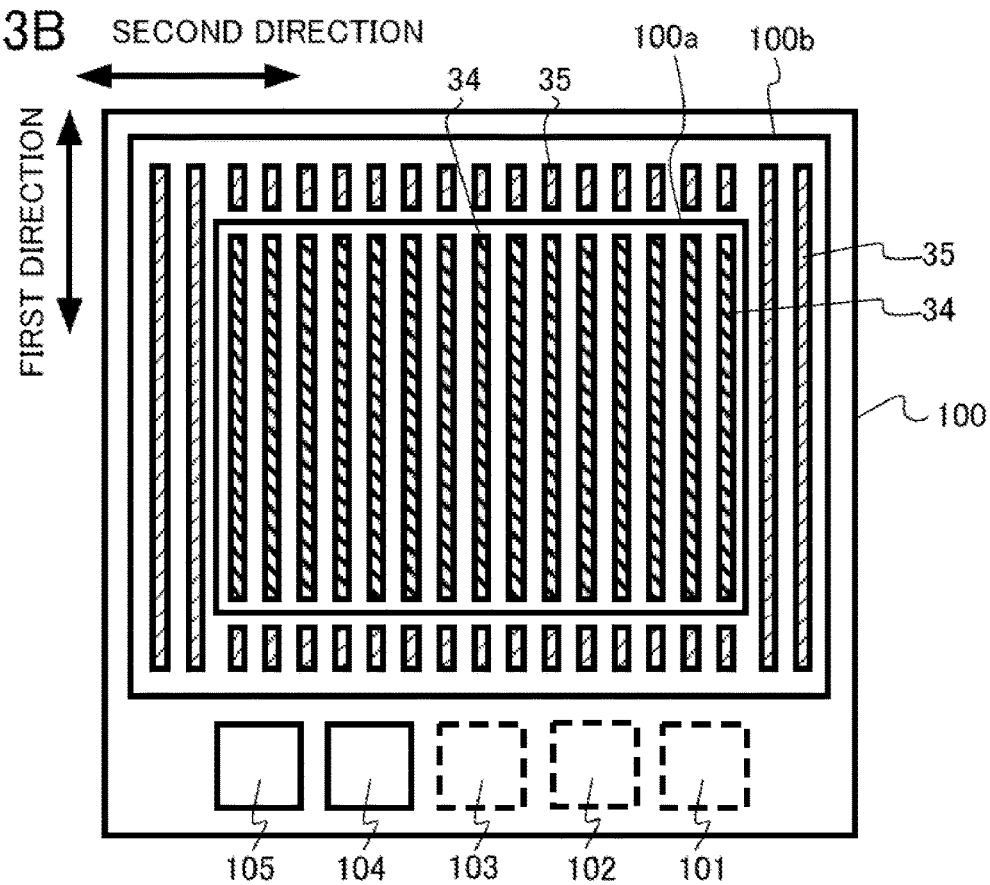

FIGS. 3A and 3B are schematic plan views of the semiconductor device of the first embodiment. FIG. 3A is a plan view seen from the surface side of the IGBT 100, that is, the first face P1 side of the semiconductor layer 10. FIG. 3B is a plan view seen from the back surface side of the IGBT 100, that is, the second face P2 side of the semiconductor layer 10.

FIG. 3A is a diagram schematically showing the arrangement of the main gate electrode 31, the control gate electrode 32, and the pre-gate electrode 33. FIG. 3B is a diagram schematically showing the arrangement of the back surface cell gate electrode 34 and the back surface termination gate electrode 35.

As shown in FIG. 3A, the main gate electrode 31, the control gate electrode 32, and the pre-gate electrode 33 are provided in the cell region 100a. The main gate electrode 31, the control gate electrode 32, and the pre-gate electrode 33 extend in the first direction.

As shown in FIG. 3B, the back surface cell gate electrode 34 is provided in the cell region 100a. In addition, the back surface termination gate electrode 35 is provided in the termination region 100b. The back surface cell gate electrode 34 and the back surface termination gate electrode 35 extend in the first direction.

The surface interlayer insulating layer 40 is provided on the first face P1 side of the semiconductor layer 10. The surface interlayer insulating layer 40 is provided between a part of the semiconductor layer 10 and the emitter electrode 12. The surface interlayer insulating layer 40 electrically separates a part of the semiconductor layer 10 from the emitter electrode 12. The surface interlayer insulating layer 40 electrically separates the main gate electrode 31, the control gate electrode 32, and the pre-gate electrode 33 from the emitter electrode 12.

The surface interlayer insulating layer 40 is, for example, silicon oxide.

The back surface interlayer insulating layer 42 is provided on the second face P2 side of the semiconductor layer 10. The back surface interlayer insulating layer 42 is provided between a part of the semiconductor layer 10 and the collector electrode 14. The back surface interlayer insulating layer 42 electrically separates a part of the semiconductor layer 10 from the collector electrode 14. The back surface interlayer insulating layer 42 electrically separates the back surface cell gate electrode 34 and the back surface termination gate electrode 35 from the collector electrode 14.

The back surface interlayer insulating layer 42 is, for example, silicon oxide.

The p-type cell collector region 64 is provided in the cell portion 10a. The cell collector region 64 is provided in a part between the drift region 68 and the second face P2. A part of the cell collector region 64 is in contact with the second face P2.

A part of the cell collector region 64 faces the back surface cell gate electrode 34 with the first back surface gate insulating film 24 interposed therebetween. The cell collector region 64 extends in the first direction on the second face P2. In the cell collector region 64 facing the back surface cell gate electrode 34, a channel of the back surface cell transistor controlled by the back surface cell gate electrode 34 is formed.

The cell collector region 64 is electrically connected to the collector electrode 14. A part of the cell collector region 64 is in contact with the collector electrode 14.

The p-type termination collector region 65 is provided in the termination portion 10b. The termination collector region 65 is provided in a part between the drift region 68 and the second face P2. A part of the termination collector region 65 is in contact with the second face P2.

A part of the termination collector region 65 faces the back surface termination gate electrode 35 with the second back surface gate insulating film 25 interposed therebetween. The termination collector region 65 extends in the first direction on the second face P2. In the termination collector region 65 facing the back surface termination gate electrode 35, a channel of the back surface termination transistor controlled by the back surface termination gate electrode 35 is formed.

The termination collector region 65 is electrically connected to the collector electrode 14. A part of the termination collector region 65 is in contact with the collector electrode 14.

The n-type cell drain region 60 is provided in the cell portion 10a. The cell drain region 60 is provided in a part between the cell collector region 64 and the second face P2. A part of the cell collector region 64 faces the back surface cell gate electrode 34 with the first back surface gate insulating film 24 interposed therebetween.

A part of the cell drain region 60 is in contact with the collector electrode 14. The cell drain region 60 extends in the first direction. The cell drain region 60 functions as a drain of the back surface cell transistor.

The n-type impurity concentration in the cell drain region 60 is higher than the n-type impurity concentration in the drift region 68.

The n-type termination drain region 62 is provided in the termination portion 10b. The termination drain region 62 is provided in a part between the termination collector region 65 and the second face P2. A part of the termination drain region 62 faces the back surface termination gate electrode 35 with the second back surface gate insulating film 25 interposed therebetween.

A part of the termination drain region 62 is in contact with the collector electrode 14. The termination drain region 62 extends in the first direction. The termination drain region 62 functions as a drain of the back surface termination transistor.

The n-type impurity concentration in the termination drain region 62 is higher than the n-type impurity concentration in the drift region 68.

The n-type drift region 68 is provided between the cell collector region 64 and the first face P1. The n-type drift region 68 is provided between the termination collector region 65 and the first face P1. The drift region 68 is provided between the cell collector region 64 and the base region 70.

The drift region 68 serves as an on-current path when the IGBT 100 is ON. The drift region 68 has a function of being depleted when the IGBT 100 is OFF to maintain the breakdown voltage of the IGBT 100.

The n-type buffer region 66 is provided between the drift region 68 and the cell collector region 64. The buffer region 66 is provided between the drift region 68 and the termination collector region 65.

A part of the buffer region 66 is in contact with the second face P2. A part of the buffer region 66 faces the back surface cell gate electrode 34 with the first back surface gate insulating film 24 interposed therebetween. A part of the buffer region 66 faces the back surface termination gate electrode 35 with the second back surface gate insulating film 25 interposed therebetween.

The n-type impurity concentration in the buffer region 66 is higher than the n-type impurity concentration in the drift region 68.

The buffer region 66 has a lower resistance than the drift region 68. By providing the buffer region 66, when the back surface cell transistor is turned on, the discharge of electrons from the drift region 68 to the collector electrode 14 through the back surface cell transistor is promoted. By providing the buffer region 66, when the back surface termination transistor is turned on, the discharge of electrons from the drift region 68 to the collector electrode 14 through the back surface termination transistor is promoted.

In addition, the buffer region 66 also has a function of suppressing the extension of the depletion layer when the IGBT 100 is OFF. In addition, the buffer region 66 may not be provided.

The p-type base region 70 is provided in the cell region 100a. The base region 70 is provided in the cell portion 10a. The base region 70 is provided between the drift region 68 and the first face P1.

A part of the base region 70 faces the main gate electrode 31 with the first surface gate insulating film 21 interposed therebetween. In the base region 70 facing the main gate electrode 31, a channel of the main gate transistor controlled by the main gate electrode 31 is formed.

A part of the base region 70 faces the control gate electrode 32 with the second surface gate insulating film 22 interposed therebetween. In the base region 70 facing the control gate electrode 32, a channel of the control gate transistor controlled by the control gate electrode 32 is formed.

A part of the base region 70 faces the pre-gate electrode 33 with the third surface gate insulating film 23 interposed therebetween. In the base region 70 facing the pre-gate electrode 33, a channel of the pre-gate transistor controlled by the pre-gate electrode 33 is formed.

The n-type emitter region 72 is provided in the cell region 100a. The emitter region 72 is provided in the cell portion 10a. The emitter region 72 is provided between the base region 70 and the first face P1. The emitter region 72 extends in the first direction on the first face P1.

A part of the emitter region 72 faces the main gate electrode 31 with the first surface gate insulating film 21 interposed therebetween. A part of the emitter region 72 is in contact with the main gate trench 51. A part of the emitter region 72 is in contact with the first surface gate insulating film 21.

A part of the emitter region 72 faces the control gate electrode 32 with the second surface gate insulating film 22 interposed therebetween. A part of the emitter region 72 is in contact with the control gate trench 52. A part of the emitter region 72 is in contact with the second surface gate insulating film 22.

A part of the emitter region 72 faces the pre-gate electrode 33 with the third surface gate insulating film 23 interposed therebetween. A part of the emitter region 72 is in contact with the pre-gate trench 53. A part of the emitter region 72 is in contact with the third surface gate insulating film 23.

The emitter region 72 is electrically connected to the emitter electrode 12. A part of the emitter region 72 is in contact with the emitter electrode 12.

The n-type impurity concentration in the emitter region 72 is higher than the n-type impurity concentration in the drift region 68. The emitter region 72 serves as a source of electrons when the IGBT 100 is ON.

The p-type contact region 74 is provided in the cell region 100a. The contact region 74 is provided in the cell portion 10a. The contact region 74 is provided between the base region 70 and the first face P1. The contact region 74 extends in the first direction on the first face P1.

The contact region 74 is electrically connected to the emitter electrode 12. The contact region 74 is in contact with the emitter electrode 12.

The p-type impurity concentration in the contact region 74 is higher than the p-type impurity concentration in the base region 70.

The p-type boundary region 76 is provided in the termination region 100b. The boundary region 76 is provided in the termination portion 10b. The boundary region 76 is provided between the drift region 68 and the first face P1. The boundary region 76 surrounds the cell portion 10a.

The p-type guard ring region 78 is provided in the termination region 100b. The guard ring region 78 is provided in the termination portion 10b. The guard ring region 78 is provided between the drift region 68 and the first face P1. The guard ring region 78 surrounds the cell portion 10a. For example, a plurality of guard ring regions 78 are provided.

By providing the boundary region 76 and the guard ring region 78, the electric field strength at the end of the cell region 100a is reduced, so that the reduction in breakdown voltage when the IGBT 100 is OFF is suppressed.

The control circuit 150 controls the IGBT 100. The control circuit 150 is, for example, a gate driver circuit. The gate driver circuit independently controls the magnitude and timing of the voltage applied to the first surface gate electrode pad 101, the second surface gate electrode pad 102, the third surface gate electrode pad 103, the first back surface gate electrode pad 104, and the second back surface gate electrode pad 105.

The control circuit 150 independently controls the first gate voltage (Vg1) applied to the main gate electrode 31, the second gate voltage (Vg2) applied to the control gate electrode 32, the third gate voltage (Vg3) applied to the pre-gate electrode 33, the fourth gate voltage (Vg4) applied to the back surface cell gate electrode 34, and the fifth gate voltage (Vg5) applied to the back surface termination gate electrode 35.

Next, the operation of the IGBT 100 will be described.

Figure 4:
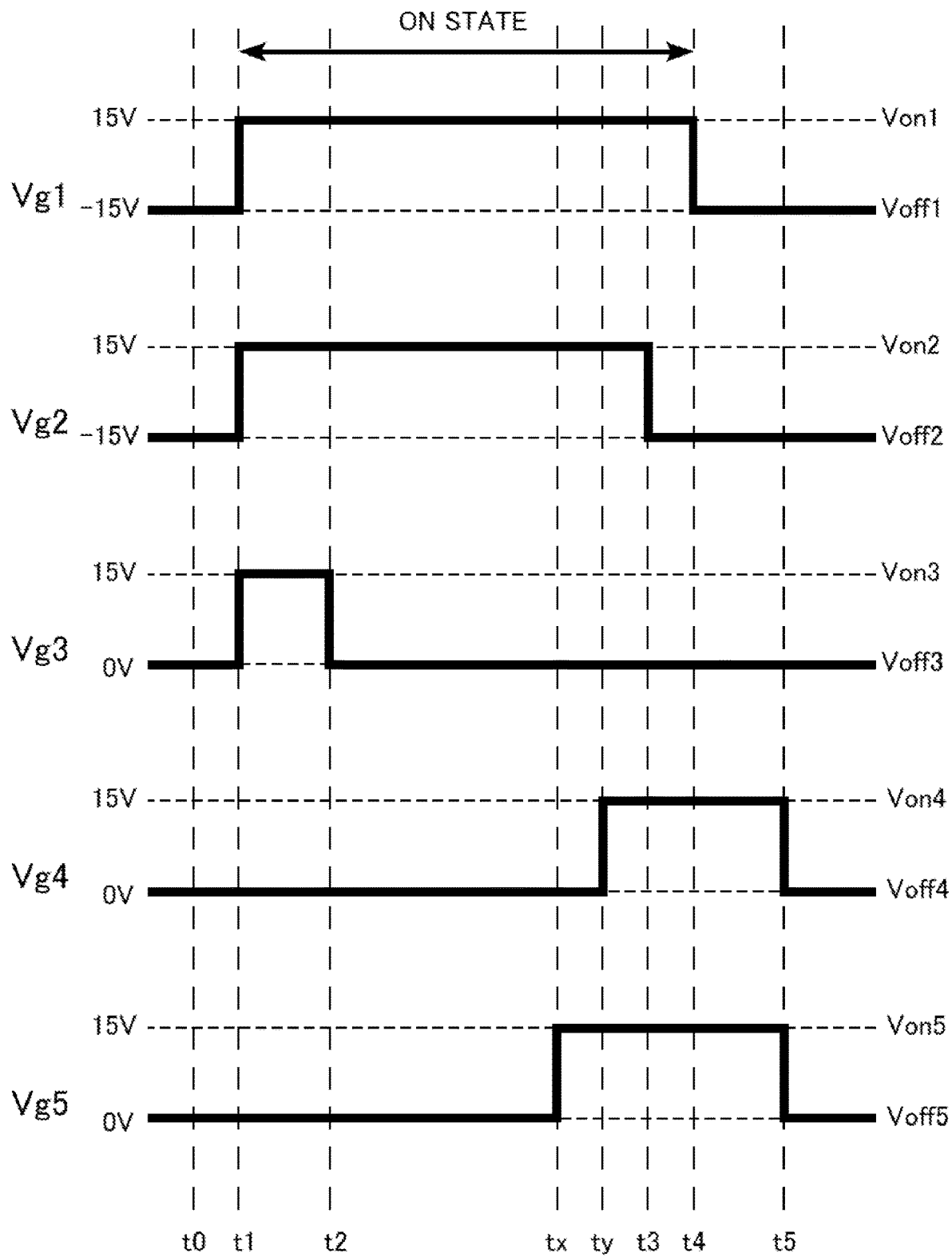
FIG. 4 is a timing chart of the semiconductor device of the first embodiment.

FIG. 4 is a timing chart of the semiconductor device of the first embodiment. FIG. 4 shows the change timing of the first gate voltage (Vg1), the second gate voltage (Vg2), the third gate voltage (Vg3), the fourth gate voltage (Vg4), and the fifth gate voltage (Vg5).

The first gate voltage (Vg1) is a gate voltage applied to the main gate transistor controlled by the main gate electrode 31. The second gate voltage (Vg2) is a gate voltage applied to the control gate transistor controlled by the control gate electrode 32. The third gate voltage (Vg3) is a gate voltage applied to the pre-gate transistor controlled by the pre-gate electrode 33. The fourth gate voltage (Vg4) is a gate voltage applied to the back surface cell transistor controlled by the back surface cell gate electrode 34. The fifth gate voltage (Vg5) is a gate voltage applied to the back surface termination transistor controlled by the back surface termination gate electrode 35.

When the IGBT 100 is OFF, the emitter voltage (Ve) is applied to the emitter electrode 12. For example, at time t0, the emitter voltage (Ve) is applied to the emitter electrode 12. The emitter voltage (Ve) is, for example, 0 V.

When the IGBT 100 is OFF, the collector voltage (Vc) is applied to the collector electrode 14. The collector voltage (Vc) is, for example, equal to or more than 200 V and equal to or less than 6500 V. The collector-emitter voltage (Vce) applied between the collector electrode 14 and the emitter electrode 12 is, for example, equal to or more than 200 V and equal to or less than 6500 V.

In addition, the first gate voltage (Vg1), the second gate voltage (Vg2), and the third gate voltage (Vg3) are voltages when the emitter voltage (Ve) is a reference voltage. In addition, the fourth gate voltage (Vg4) and the fifth gate voltage (Vg5) are voltages when the collector voltage (Vc) is a reference voltage.

First, the change timing of the first gate voltage (Vg1) applied to the main gate transistor will be described.

For example, at time t0, a first turn-off voltage (Voff1) is applied as the first gate voltage (Vg1). The first turn-off voltage (Voff1) is a voltage equal to or less than the threshold voltage at which the main gate transistor is not turned on.

The first turn-off voltage (Voff1) is, for example, 0 V or a negative voltage. FIG. 4 illustrates a case where the first turn-off voltage (Voff1) is −15 V.

At time t1, a first turn-on voltage (Von1) is applied as the first gate voltage (Vg1). The first turn-on voltage (Von1) is a positive voltage that exceeds the threshold voltage of the main gate transistor. FIG. 4 illustrates a case where the first turn-on voltage (Von1) is 15 V.

When the first turn-on voltage (Von1) is applied to the main gate transistor, the IGBT 100 is turned on. The IGBT 100 is turned on at time t1.

By applying the first turn-on voltage (Von1) to the main gate transistor, an n-type inversion layer is formed in the vicinity of the interface between the p-type base region 70 and the first surface gate insulating film 21. By forming the n-type inversion layer, electrons are injected from the n-type emitter region 72 into the n-type drift region 68 through the n-type inversion layer. The electrons injected into the n-type drift region 68 forward bias the pn junction formed between the n-type buffer region 66 and the p-type cell collector region 64 and between the n-type buffer region 66 and the p-type termination collector region 65. The electrons reach the collector electrode 14 and cause hole injection from the p-type cell collector region 64 and the p-type termination collector region 65. Therefore, the IGBT 100 is turned on.

At time t4, the first turn-off voltage (Voff1) is applied as the first gate voltage (Vg1). When the first turn-off voltage (Voff1) is applied to the main gate transistor, the IGBT 100 is turned off. Between time t1 and time t4, the IGBT 100 is ON.

Next, the change timing of the second gate voltage (Vg2) applied to the control gate transistor will be described.

For example, at time t0, a second turn-off voltage (Voff2) is applied as the second gate voltage (Vg2). The second turn-off voltage (Voff2) is a voltage equal to or less than the threshold voltage at which the control gate transistor is not turned on.

The second turn-off voltage (Voff2) is, for example, a negative voltage. FIG. 4 illustrates a case where the second turn-off voltage (Voff2) is −15 V.

At time t1, a second turn-on voltage (Von2) is applied as the second gate voltage (Vg2). The second turn-on voltage (Von2) is a positive voltage that exceeds the threshold voltage of the control gate transistor. FIG. 4 illustrates a case where the second turn-on voltage (Von2) is 15 V.

By applying the second turn-on voltage (Von2) to the control gate transistor, an n-type inversion layer is formed in the vicinity of the interface between the p-type base region 70 and the second surface gate insulating film 22. By forming the n-type inversion layer, electrons are injected from the n-type emitter region 72 into the n-type drift region 68 through the n-type inversion layer.

At time t3 before time t4, the second turn-off voltage (Voff2) is applied as the second gate voltage (Vg2). By applying the second turn-off voltage (Voff2) to the control gate transistor, the injection of electrons into the drift region 68 through the control gate transistor is blocked. In addition, by setting the second gate voltage (Vg2) to a negative voltage, a p-type accumulation layer is formed in the p-type base region 70 near the control gate trench 52. The formation of the p-type accumulation layer promotes the discharge of holes to the emitter electrode 12. Therefore, the amount of carriers in the drift region 68 is reduced.

Next, the change timing of the third gate voltage (Vg3) applied to the pre-gate transistor will be described.

For example, at time t0, a third turn-off voltage (Voff3) is applied as the third gate voltage (Vg3). The third turn-off voltage (Voff3) is a voltage equal to or less than the threshold voltage at which the pre-gate transistor is not turned on.

The third turn-off voltage (Voff3) is, for example, 0 V or a negative voltage. FIG. 4 illustrates a case where the third turn-off voltage (Voff3) is 0 V.

At time t1, a third turn-on voltage (Von3) is applied as the third gate voltage (Vg3). The third turn-on voltage (Von3) is a positive voltage that exceeds the threshold voltage of the pre-gate transistor. FIG. 4 illustrates a case where the third turn-on voltage (Von3) is 15 V.

By applying the third turn-on voltage (Von3) to the pre-gate transistor, the pre-gate transistor is turned on. By applying the third turn-on voltage (Von3) to the pre-gate transistor, an n-type inversion layer is formed in the vicinity of the interface between the p-type base region 70 and the third surface gate insulating film 23. By forming the n-type inversion layer, electrons are injected from the n-type emitter region 72 into the n-type drift region 68 through the n-type inversion layer.

At time t2 before time t3, the third turn-off voltage (Voff3) is applied as the third gate voltage (Vg3). When the third turn-off voltage (Voff3) is applied to the pre-gate transistor, the pre-gate transistor is turned off. When the pre-gate transistor is turned off, the injection of electrons into the drift region 68 through the pre-gate transistor is blocked. Therefore, the amount of electrons injected into the drift region 68 is reduced.

In addition, for example, at time t3, a negative voltage may be applied as the third gate voltage (Vg3). By applying the negative voltage as the third gate voltage (Vg3), a p-type accumulation layer is formed in the p-type base region 70 near the pre-gate trench 53. The formation of the p-type accumulation layer promotes the discharge of holes to the emitter electrode 12. Therefore, the amount of carriers in the drift region 68 is reduced.

Next, the change timing of the fourth gate voltage (Vg4) applied to the back surface cell transistor will be described.

For example, at time t0, a fourth turn-off voltage (Voff4) is applied as the fourth gate voltage (Vg4). The fourth turn-off voltage (Voff4) is a voltage equal to or less than the threshold voltage at which the back surface cell transistor is not turned on.

The fourth turn-off voltage (Voff4) is, for example, 0 V or a negative voltage. FIG. 4 illustrates a case where the fourth turn-off voltage (Voff4) is 0 V.

At time ty, a fourth turn-on voltage (Von4) is applied as the fourth gate voltage (Vg4). The fourth turn-on voltage (Von4) is a positive voltage that exceeds the threshold voltage of the back surface cell transistor. FIG. 4 illustrates a case where the fourth turn-on voltage (Von4) is 15 V.

By applying the fourth turn-on voltage (Von4) to the back surface cell transistor, an n-type inversion layer is formed in the vicinity of the interface between the p-type cell collector region 64 and the first back surface gate insulating film 24.

By forming the n-type inversion layer in the vicinity of the interface between the p-type cell collector region 64 and the first back surface gate insulating film 24, a path is formed in which electrons are discharged from the n-type buffer region 66 of the cell portion 10a to the collector electrode 14 through the n-type inversion layer and the n-type cell drain region 60. That is, a state in which the n-type buffer region 66 of the cell portion 10a and the collector electrode 14 are short-circuited, a so-called anode short circuit occurs.

The occurrence of the anode short circuit prevents electrons from reaching the collector electrode 14 from the n-type buffer region 66 of the cell portion 10a through the p-type cell collector region 64. Therefore, the injection of holes from the p-type cell collector region 64 into the drift region 68 of the cell portion 10a is suppressed.

Then, at time t5, the fourth turn-off voltage (Voff4) is applied as the fourth gate voltage (Vg4) to turn off the back surface cell transistor.

Next, the change timing of the fifth gate voltage (Vg5) applied to the back surface termination transistor will be described.

For example, at time t0, a fifth turn-off voltage (Voff5) is applied as the fifth gate voltage (Vg5). The fifth turn-off voltage (Voff5) is a voltage equal to or less than the threshold voltage at which the back surface termination transistor is not turned on.

The fifth turn-off voltage (Voff5) is, for example, 0 V or a negative voltage. FIG. 4 illustrates a case where the fifth turn-off voltage (Voff5) is 0 V.

At time tx before time ty, a fifth turn-on voltage (Von5) is applied as the fifth gate voltage (Vg5). The fifth turn-on voltage (Von5) is a positive voltage that exceeds the threshold voltage of the back surface termination transistor. FIG. 4 illustrates a case where the fifth turn-on voltage (Von5) is 15 V.

By applying the fifth turn-on voltage (Von5) to the back surface termination transistor, an n-type inversion layer is formed in the vicinity of the interface between the p-type termination collector region 65 and the second back surface gate insulating film 25.

By forming the n-type inversion layer in the vicinity of the interface between the p-type termination collector region 65 and the second back surface gate insulating film 25, a path is formed in which electrons are discharged from the n-type buffer region 66 of the termination portion 10b to the collector electrode 14 through the n-type inversion layer and the n-type termination drain region 62. That is, a state in which the buffer region 66 of the n-type termination portion 10b and the collector electrode 14 are short-circuited, a so-called anode short circuit occurs.

The occurrence of the anode short circuit prevents electrons from reaching the collector electrode 14 from the n-type buffer region 66 of the termination portion 10b through the p-type termination collector region 65. Therefore, the injection of holes from the p-type termination collector region 65 into the drift region 68 of the termination portion 10b is suppressed.

In addition, the time tx may be before the time t3 or after the time t3. In addition, the time tx may be before the time t4 or after the time t4.

Then, at time t5, the fifth turn-off voltage (Voff5) is applied as the fifth gate voltage (Vg5) to turn off the back surface termination transistor.

The control circuit 150 controls the magnitude and timing of the first gate voltage (Vg1) applied to the first surface gate electrode pad 101, the second gate voltage (Vg2) applied to the second surface gate electrode pad 102, the third gate voltage (Vg3) applied to the third surface gate electrode pad 103, the fourth gate voltage (Vg4) applied to the first back surface gate electrode pad 104, and the fifth gate voltage (Vg5) applied to the second back surface gate electrode pad 105, thereby realizing the operation of the IGBT 100.

For example, the control circuit 150 applies the first turn-on voltage (Von1) to the first surface gate electrode pad 101 at time t1, applies the second turn-on voltage (Von2) to the second surface gate electrode pad 102 at time t1, and applies the third turn-on voltage (Von3) to the third surface gate electrode pad 103 at time t1. Then, the third turn-off voltage (Voff3) is applied to the third surface gate electrode pad 103 at time t2 after a predetermined time has passed from time t1. Then, the fifth turn-on voltage (Von5) is applied to the second back surface gate electrode pad 105 at time tx after a predetermined time has passed from time t2. Then, the fourth turn-on voltage (Von4) is applied to the first back surface gate electrode pad 104 at time ty after a predetermined time has passed from time tx.

For example, the control circuit 150 applies the third turn-on voltage (Von3) to the third surface gate electrode pad 103 at time t1, and then applies the first turn-off voltage (Voff1) to the first surface gate electrode pad 101 at time t4 after a predetermined time has passed. Then, the fifth turn-on voltage (Von5) is applied to the second back surface gate electrode pad 105 at time tx before time t4.

Next, the function and effect of the semiconductor device of the first embodiment will be described.

The IGBT 100 of the first embodiment includes a control gate transistor, which can be controlled independently of the main gate transistor, on the surface side of the semiconductor layer 10. By applying a negative voltage to the gate electrode of the control gate transistor to turn the control gate transistor off at time t3 before time t4 at which the IGBT 100 is turned off, the discharge of holes to the emitter electrode 12 is promoted. Therefore, the amount of carriers to be discharged during the turn-off operation of the IGBT 100 can be reduced as compared with a case where the control gate transistor is not provided. Therefore, the turn-off loss of the IGBT 100 can be reduced.

For example, by applying a negative voltage to the gate electrode of the pre-gate transistor at time t3, the amount of carriers to be discharged during the turn-off operation can be further reduced. Therefore, the turn-off loss of the IGBT 100 can be further reduced.

In addition, the IGBT 100 of the first embodiment includes a pre-transistor, which can be controlled independently of the main gate transistor and the control gate transistor, on the surface side of the semiconductor layer 10. By turning on the pre-transistor at time t1 at which the IGBT 100 is turned on, the amount of electrons injected into the drift region 68 increases as compared with a case where the pre-transistor is not provided. Therefore, the turn-on time of the IGBT 100 is shortened as compared with the case where the pre-transistor is not provided. Therefore, the turn-on loss of the IGBT 100 can be reduced.

Then, the pre-transistor is turned off at time t2 before time t4 at which the IGBT 100 is turned off. By turning off the pre-transistor, the saturation current of the IGBT 100 is reduced. Therefore, for example, it is possible to suppress damage to the IGBT 100 when a load short circuit occurs and a large current flows through the IGBT 100.

In addition, the IGBT 100 of the first embodiment includes a back surface cell transistor on the back surface side of the semiconductor layer 10. By turning on the back surface cell transistor during the turn-off operation of the IGBT 100, the injection of holes into the drift region 68 of the cell portion 10a is suppressed. By suppressing the injection of holes into the drift region 68, the turn-off loss is reduced as compared with a case where the back surface cell transistor is not provided. Therefore, it is possible to reduce the power consumption of the IGBT 100.

In addition, in the IGBT 100 of the first embodiment, the termination region 100b is provided around the cell region 100a. In the termination region 100b, the boundary region 76 and the guard ring region 78 are provided. By providing the boundary region 76 and the guard ring region 78, the electric field strength at the end of the cell region 100a is reduced, so that the reduction in breakdown voltage when the IGBT 100 is OFF is suppressed.

When the IGBT 100 is ON, the on-current also flows between the emitter electrode 12 and the collector electrode 14 in the termination region 100b. Therefore, when the IGBT 100 is ON, carriers are also accumulated in the drift region 68 of the termination portion 10b. In other words, when the IGBT 100 is ON, carriers have spread up to the termination region 100b where no transistor is present on the surface.

During the turn-off operation of the IGBT 100, it is necessary to discharge the carriers accumulated in the drift region 68 of the termination portion 10b. However, there is no carrier discharge path on the surface side of the termination region 100b. For this reason, the carriers are concentrated and discharged at the end of the cell region 100a. As a result, current concentration occurs at the end of the cell region 100a. Therefore, there is a possibility that the IGBT 100 will be damaged due to current concentration.

The IGBT 100 of the first embodiment includes a back surface termination transistor, which can be controlled independently of the back surface cell transistor, on the back surface side of the semiconductor layer 10 in the termination region 100b. The back surface termination transistor is turned on at time tx before time ty at which the back surface cell transistor is turned on. By turning on the back surface termination transistor, the injection of holes into the n-type drift region 68 of the termination portion 10b is suppressed.

By turning on the back surface termination transistor before the back surface cell transistor, the carriers accumulated in the drift region 68 of the termination portion 10b can be selectively reduced. Therefore, it is possible to suppress the occurrence of current concentration at the end of the cell region 100a during the turn-off operation of the IGBT 100. As a result, damage to the IGBT 100 due to current concentration can be suppressed.

From the viewpoint of suppressing damage to the IGBT 100 due to current concentration, it is preferable to turn on the back surface termination transistor before the turn-off operation of the IGBT 100. In other words, it is preferable to turn on the back surface termination transistor before time t4 at which the IGBT 100 is turned off. In other words, it is preferable that time tx is before time t4. In other words, it is preferable to apply the fifth turn-on voltage (Von5) to the second back surface gate electrode pad 105 before applying the first turn-off voltage (Voff1) to the first surface gate electrode pad 101.

As described above, according to the first embodiment, it is possible to realize a semiconductor device and a semiconductor circuit in which turn-off loss is reduced to suppress damage due to current concentration.

Second Embodiment

A semiconductor device and a semiconductor circuit of a second embodiment are different from the semiconductor device and the semiconductor circuit of the first embodiment in that the first gate electrode extends in the first direction parallel to the first face, the fourth gate electrode extends in the second direction parallel to the first face and perpendicular to the first direction, and the fifth gate electrode extends in a direction perpendicular to the fourth gate electrode. Hereinafter, the description of a part of the content overlapping the first embodiment may be omitted.

Similar to the first embodiment, the semiconductor device of the second embodiment is an IGBT 200 having a double-sided gate structure in which a gate electrode is provided on the surface side and the back surface side of a semiconductor layer. In addition, the IGBT 200 includes three types of gate electrodes that are independently controlled on the surface side of the semiconductor layer. In addition, the IGBT 200 includes two types of gate electrodes that are independently controlled on the back surface side of the semiconductor layer.

Figure 5A:
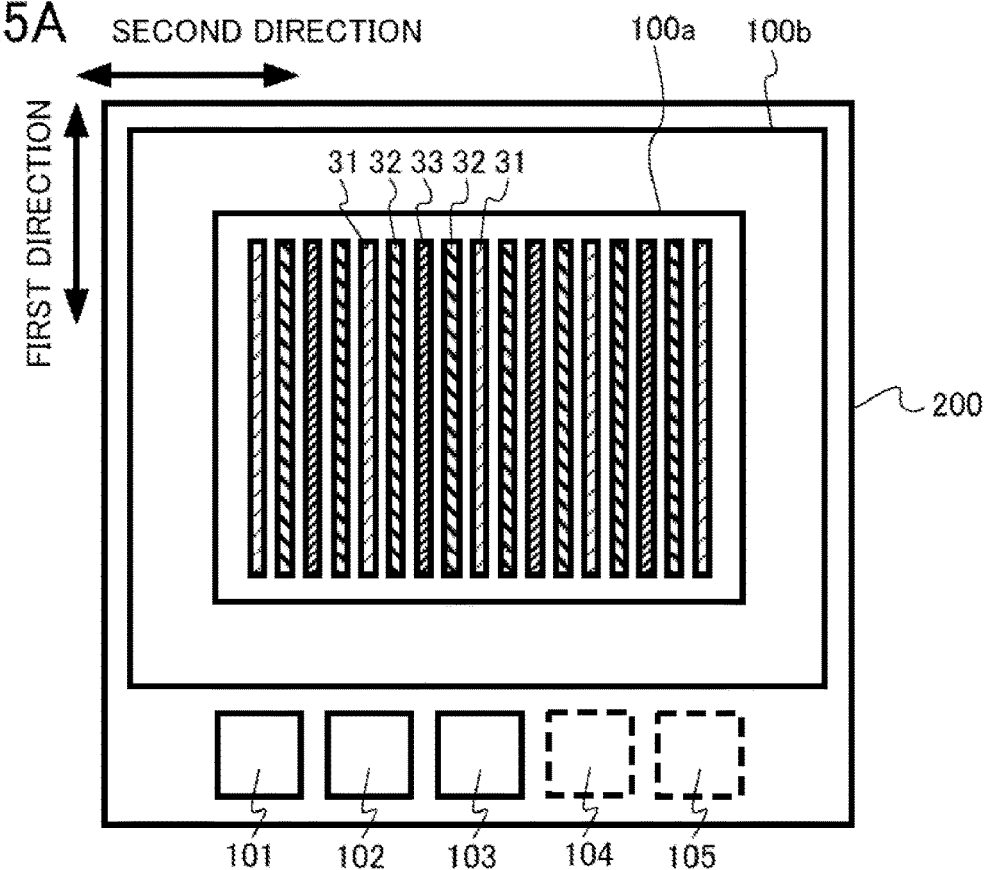
FIGS. 5A and 5B are schematic plan views of a semiconductor device of a second embodiment.
Figure 5B:
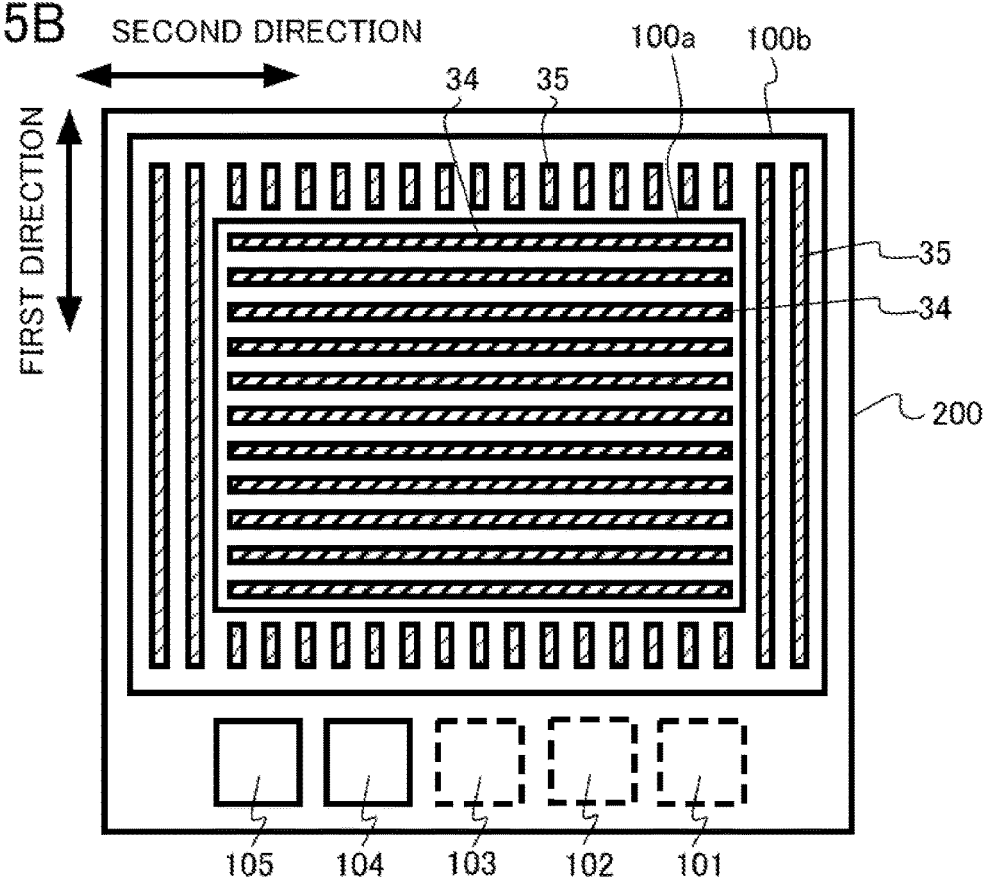

FIGS. 5A and 5B are schematic plan views of the semiconductor device of the second embodiment. FIG. 5A is a plan view seen from the surface side of the IGBT 200, that is, the first face P1 side of the semiconductor layer 10. FIG. 5B is a plan view seen from the back surface side of the IGBT 200, that is, the second face P2 side of the semiconductor layer 10.

FIG. 5A is a diagram schematically showing the arrangement of the main gate electrode 31, the control gate electrode 32, and the pre-gate electrode 33. FIG. 5B is a diagram schematically showing the arrangement of the back surface cell gate electrode 34 and the back surface termination gate electrode 35.

The IGBT 200 includes a cell region 100a, a termination region 100b, a first surface gate electrode pad 101 (first electrode pad), a second surface gate electrode pad 102 (second electrode pad), a third surface gate electrode pad 103 (third electrode pad), a first back surface gate electrode pad 104 (fourth electrode pad), and a second back surface gate electrode pad 105 (fifth electrode pad).

The termination region 100b surrounds the cell region 100a. The first surface gate electrode pad 101, the second surface gate electrode pad 102, and the third surface gate electrode pad 103 are disposed on the surface side of the IGBT 200. In addition, the first back surface gate electrode pad 104 and the second back surface gate electrode pad 105 are disposed on the back surface side of the IGBT 200.

As shown in FIG. 5A, the main gate electrode 31, the control gate electrode 32, and the pre-gate electrode 33 are provided in the cell region 100a. The main gate electrode 31, the control gate electrode 32, and the pre-gate electrode 33 extend in the first direction.

As shown in FIG. 5B, the back surface cell gate electrode 34 is provided in the cell region 100a. The back surface cell gate electrode 34 extends in the second direction perpendicular to the first direction.

In addition, the back surface termination gate electrode 35 is provided in the termination region 100b. The back surface termination gate electrode 35 extends in the first direction perpendicular to the second direction. The back surface termination gate electrode 35 extends in a direction perpendicular to the back surface cell gate electrode 34.

Since the back surface cell gate electrode 34 extends in a direction perpendicular to the main gate electrode 31, the control gate electrode 32, and the pre-gate electrode 33, the on-current flow of the IGBT 200 becomes uniform. For this reason, local on-current concentration is unlikely to occur. Therefore, damage to the IGBT 200 due to current concentration is suppressed.

As described above, according to the second embodiment, it is possible to realize a semiconductor device and a semiconductor circuit in which turn-off loss is reduced to suppress damage due to current concentration.

Third Embodiment

A semiconductor device and a semiconductor circuit of a third embodiment are different from the semiconductor device and the semiconductor circuit of the first embodiment in that the third semiconductor region and the second trench are spaced from each other. Hereinafter, the description of a part of the content overlapping the first embodiment may be omitted.

Similar to the first embodiment, the semiconductor device of the third embodiment is an IGBT 300 having a double-sided gate structure in which a gate electrode is provided on the surface side and the back surface side of a semiconductor layer. In addition, the IGBT 300 includes three types of gate electrodes that are independently controlled on the surface side of the semiconductor layer. In addition, the IGBT 300 includes two types of gate electrodes that are independently controlled on the back surface side of the semiconductor layer.

Figure 6:
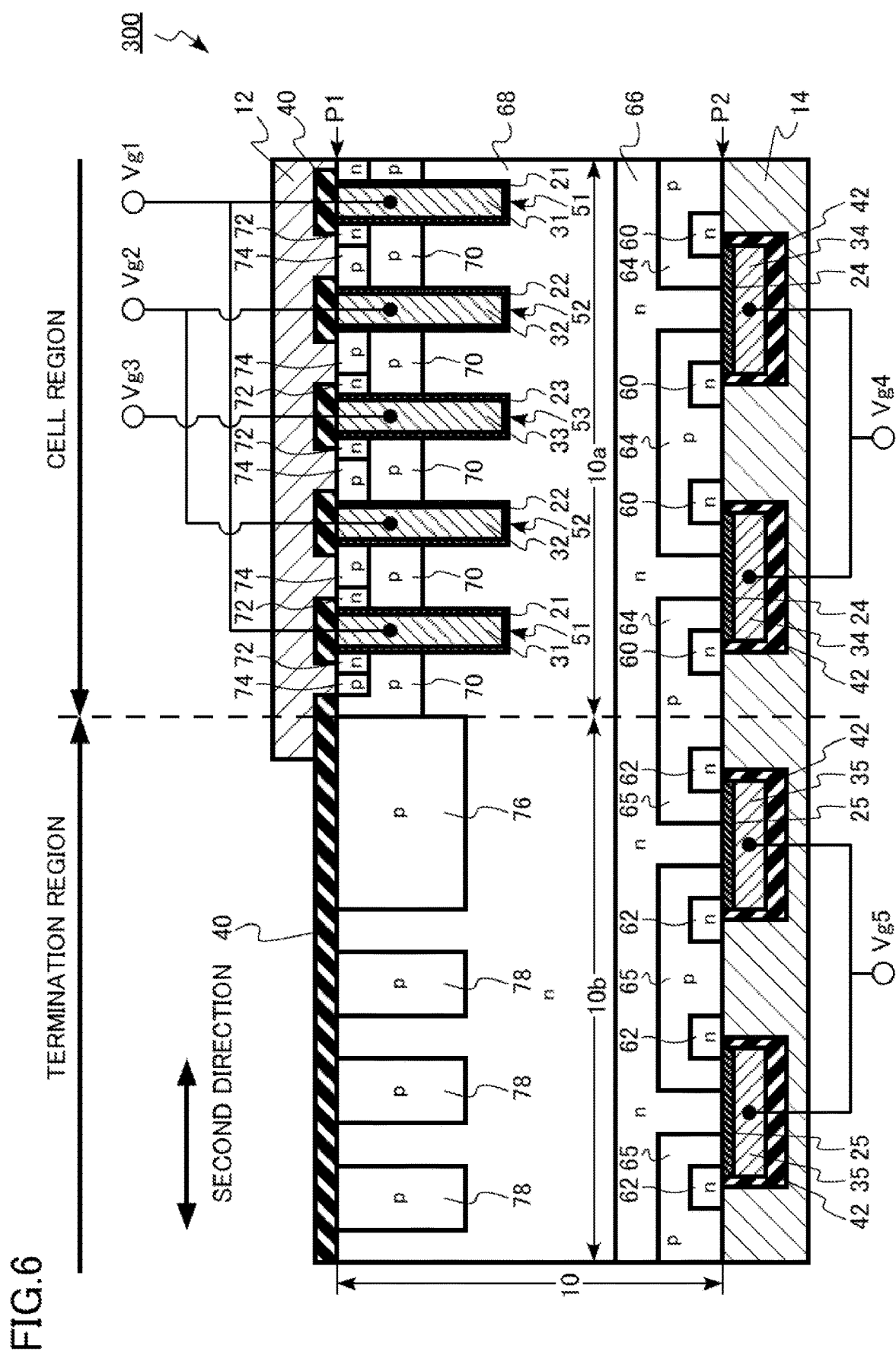
FIG. 6 is a schematic cross-sectional view of a part of a semiconductor device of a third embodiment.

FIG. 6 is a schematic cross-sectional view of a part of the semiconductor device of the third embodiment. FIG. 6 is a diagram corresponding to FIG. 2 of the first embodiment.

The IGBT 300 of the third embodiment includes a semiconductor layer 10, an emitter electrode 12 (first electrode), a collector electrode 14 (second electrode), a first surface gate insulating film 21, a second surface gate insulating film 22, a third surface gate insulating film 23, a first back surface gate insulating film 24, a second back surface gate insulating film 25, a main gate electrode 31 (first gate electrode), a control gate electrode 32 (second gate electrode), a pre-gate electrode 33 (third gate electrode), a back surface cell gate electrode 34 (fourth gate electrode), a back surface termination gate electrode 35 (fifth gate electrode), a surface interlayer insulating layer 40, and a back surface interlayer insulating layer 42.

In the semiconductor layer 10, a main gate trench 51 (first trench), a control gate trench 52 (second trench), a pre-gate trench 53 (third trench), an n-type cell drain region 60 (sixth semiconductor region), an n-type termination drain region 62 (seventh semiconductor region), a p-type cell collector region 64 (fourth semiconductor region), a p-type termination collector region 65 (fifth semiconductor region), an n-type buffer region 66, an n-type drift region 68 (first semiconductor region), a p-type base region 70 (second semiconductor region), an n-type emitter region 72 (third semiconductor region), a p-type contact region 74, a p-type boundary region 76, and a p-type guard ring region 78 are provided.

The emitter region 72 is spaced from the control gate trench 52. The emitter region 72 is not in contact with the control gate trench 52.

The emitter region 72 is spaced from the second surface gate insulating film 22. The emitter region 72 is not in contact with the second surface gate insulating film 22.

Figure 7:
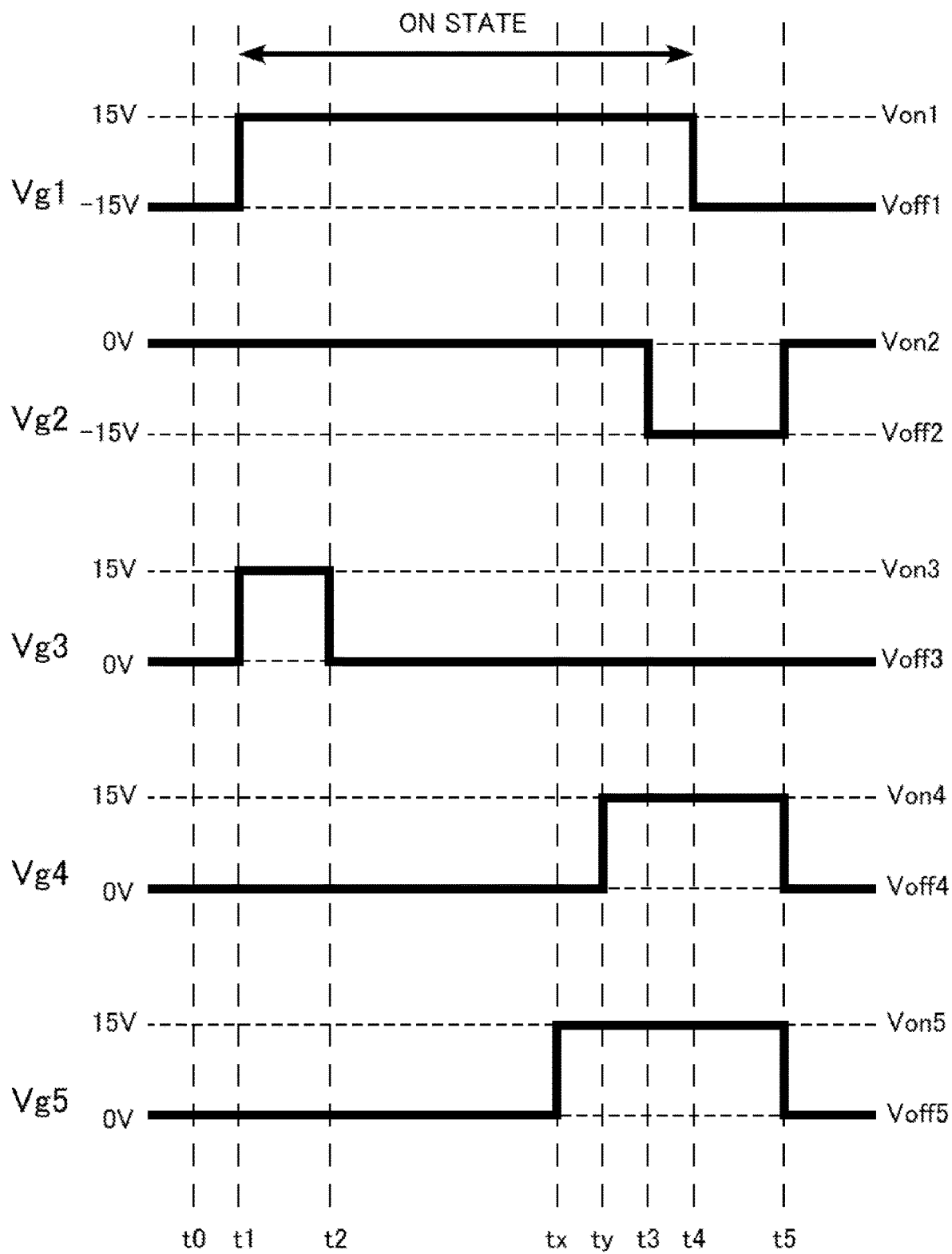
FIG. 7 is a timing chart of the semiconductor device of the third embodiment.

FIG. 7 is a timing chart of the semiconductor device of the third embodiment. FIG. 7 shows the change timing of the first gate voltage (Vg1), the second gate voltage (Vg2), the third gate voltage (Vg3), the fourth gate voltage (Vg4), and the fifth gate voltage (Vg5).

FIG. 7 is different from the timing chart shown in FIG. 4 of the first embodiment only in the change timing of the second gate voltage (Vg2) applied to the control gate electrode 32. Therefore, only the timing of the second gate voltage (Vg2) will be described.

In addition, even if the second gate voltage (Vg2) applied to the control gate electrode 32 is changed, no transistor operation occurs because the emitter region 72 is not in contact with the control gate trench 52. However, in order to be consistent with the description of the first embodiment, the terms the second turn-on voltage (Von2) and the second turn-off voltage (Voff2) are used below for convenience.

For example, at time t0, the second turn-on voltage (Von2) is applied as the second gate voltage (Vg2). The second turn-on voltage (Von2) is a voltage higher than the voltage at which a p-type accumulation layer is formed in the p-type base region 70 near the control gate trench 52.

The second turn-on voltage (Von2) is, for example, 0 V or a positive voltage. FIG. 7 illustrates a case where the second turn-on voltage (Von2) is 0 V.

At time t3 before time t4, the second turn-off voltage (Voff2) is applied as the second gate voltage (Vg2). The second turn-off voltage (Voff2) is a voltage equal to or less than the voltage at which a p-type accumulation layer is formed in the p-type base region 70 near the control gate trench 52. The second turn-off voltage (Voff2) is a negative voltage. FIG. 7 illustrates a case where the second turn-off voltage (Voff2) is −15 V.

By applying the second turn-off voltage (Voff2) to the control gate transistor, a p-type accumulation layer is formed in the p-type base region 70 near the control gate trench 52. The formation of the p-type accumulation layer promotes the discharge of holes to the emitter electrode 12. Therefore, the amount of carriers in the drift region 68 is reduced.

Then, at time t5, the second turn-on voltage (Von2) is applied as the second gate voltage (Vg2) to remove the p-type accumulation layer.

In the IGBT 300 of the third embodiment, even if the second gate voltage (Vg2) applied to the control gate electrode 32 is changed, no transistor operation occurs. Therefore, the operation of the IGBT 300 is more stable than that of the IGBT 100.

In addition, since there is no emitter region 72 in contact with the control gate trench 52, the discharge of holes to the emitter electrode 12 is promoted as compared with a case where the emitter region 72 is present. Therefore, the turn-off loss is further reduced as compared with the IGBT 100.

As described above, according to the third embodiment, it is possible to realize a semiconductor device and a semiconductor circuit in which turn-off loss is reduced and destruction due to current concentration is suppressed.

In the first to third embodiments, the case where the semiconductor layer is single crystal silicon has been described as an example. However, the semiconductor layer is not limited to the single crystal silicon. For example, other single crystal semiconductors, such as single crystal silicon carbide, may be used.

In the first to third embodiments, the case where each of the main gate electrode 31, the control gate electrode 32, the pre-gate electrode 33, the back surface cell gate electrode 34, and the back surface termination gate electrode 35 has a stripe shape has been described as an example. However, the shapes of the main gate electrode 31, the control gate electrode 32, the pre-gate electrode 33, the back surface cell gate electrode 34, and the back surface termination gate electrode 35 are not limited to the stripe shape. For example, any or all of the main gate electrode 31, the control gate electrode 32, the pre-gate electrode 33, the back surface cell gate electrode 34, and the back surface termination gate electrode 35 may have a shape other than the stripe shape, such as a polygonal shape.

In the first to third embodiments, the case where the three types of gate electrodes of the main gate electrode 31, the control gate electrode 32, and the pre-gate electrode 33 are provided on the surface side of the semiconductor layer 10 has been described as an example. However, in addition to the three types of gate electrodes, a dummy gate electrode may be further provided. The dummy gate electrode is, for example, a gate electrode in which the electric potential of the gate electrode in the trench is fixed to the electric potential of the emitter electrode 12.

In the first to third embodiments, the case where the back surface cell transistor and the back surface termination transistor are planar gate type transistors has been described as an example. However, either or both of the back surface cell transistor and the back surface termination transistor may be a trench gate type transistor.

In the first to third embodiments, the case where the first conductive type is an n type and the second conductive type is a p type has been described as an example. However, the first conductive type can be a p type and the second conductive type can be an n type.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device, comprising:
    a semiconductor layer having a first face and a second face opposite to the first face and including a first trench provided in a first face side of the semiconductor layer, a second trench provided in the first face side of the semiconductor layer, and a third trench provided in the first face side of the semiconductor layer;

a first gate electrode provided in the first trench;

a second gate electrode provided in the second trench;

a third gate electrode provided in the third trench;

a fourth gate electrode provided on a second face side of the semiconductor layer;

a fifth gate electrode provided on the second face side of the semiconductor layer;

a first electrode in contact with the first face;

a second electrode in contact with the second face;

a first electrode pad electrically connected to the first gate electrode;

a second electrode pad electrically connected to the second gate electrode;

a third electrode pad electrically connected to the third gate electrode;

a fourth electrode pad electrically connected to the fourth gate electrode; and a fifth electrode pad electrically connected to the fifth gate electrode, wherein the semiconductor layer further includes:

a first semiconductor region of a first conductive type;

a second semiconductor region of a second conductive type provided between the first semiconductor region of the first conductive type and the first face, facing the first gate electrode, facing the second gate electrode, and facing the third gate electrode;

a third semiconductor region of a first conductive type provided between the second semiconductor region of the second conductive type and the first face and in contact with the first electrode, the third semiconductor region of the first conductive type being in contact with the first trench, the second trench, and the third trench;

a fourth semiconductor region of a second conductive type provided between the first semiconductor region of the first conductive type and the second face, facing the fourth gate electrode, and in contact with the second electrode;

a fifth semiconductor region of a second conductive type provided between the first semiconductor region of the first conductive type and the second face, facing the fifth gate electrode, and in contact with the second electrode;

a sixth semiconductor region of a first conductive type provided between the fourth semiconductor region of the second conductive type and the second face, and in contact with the second electrode; and a seventh semiconductor region of a first conductive type provided between the fifth semiconductor region of the second conductive type and the second face, and in contact with the second electrode.

2. A semiconductor circuit, comprising:

the semiconductor device according to claim 1; and a control circuit for controlling a voltage to be applied to the first electrode pad, the second electrode pad, the third electrode pad, the fourth electrode pad, and the fifth electrode pad.

3. The semiconductor circuit according to claim 2, wherein the control circuit is configured to apply a first turn-on voltage to the first electrode pad, to apply a second turn-on voltage to the second electrode pad, and to apply a third turn-on voltage to the third electrode pad, the control circuit is configured to apply a first turn-off voltage to the third electrode pad, after a first predetermined time passes from the application of the first turn-on voltage to the first electrode pad, the application of the second turn-on voltage to the second electrode pad, and the application of the third turn-on voltage to the third electrode pad, the control circuit is configured to apply a fourth turn-on voltage to the fifth electrode pad, after a second predetermined time passes from the application of the first turn-off voltage to the third electrode pad, and the control circuit is configured to apply a fifth turn-on voltage to the fourth electrode pad, after a third predetermined time passes from the application of the fourth turn-on voltage to the fifth electrode pad.

4. The semiconductor circuit according to claim 3, wherein, the control circuit is configured to apply a second turn-off voltage to the first electrode pad, after a fourth predetermined time passes from the application of the first turn-on voltage to the first electrode pad, the application of the second turn-on voltage to the second electrode pad, and the application of the third turn-on voltage to the third electrode pad, the control circuit is configured to apply a third turn-off voltage to the second electrode pad, after the application of the first turn-off voltage to the third electrode pad and before the application of the second turn-off voltage to the first electrode pad, and the control circuit is configured to apply the fourth turn-on voltage to the fifth electrode pad, before the application of the second turn-off voltage to the first electrode pad.

5. A semiconductor device, comprising:

a semiconductor layer having a first face and a second face opposite to the first face and including a first trench provided in a first face side of the semiconductor layer, a second trench provided in the first face side of the semiconductor layer, and a third trench provided in the first face side of the semiconductor layer;

a first gate electrode provided in the first trench;

a second gate electrode provided in the second trench;

a third gate electrode provided in the third trench;

a fourth gate electrode provided on a second face side of the semiconductor layer;

a fifth gate electrode provided on the second face side of the semiconductor layer;

a first electrode in contact with the first face;

a second electrode in contact with the second face;

a first electrode pad electrically connected to the first gate electrode;

a second electrode pad electrically connected to the second gate electrode;

a third electrode pad electrically connected to the third gate electrode;

a fourth electrode pad electrically connected to the fourth gate electrode; and a fifth electrode pad electrically connected to the fifth gate electrode, wherein the semiconductor layer further includes:

a first semiconductor region of a first conductive type;

a second semiconductor region of a second conductive type provided between the first semiconductor region of the first conductive type and the first face, facing the first gate electrode, facing the second gate electrode, and facing the third gate electrode;

a third semiconductor region of a first conductive type provided between the second semiconductor region of the second conductive type and the first face and in contact with the first electrode, the third semiconductor region of the first conductive type being in contact with the first trench and the third trench, the third semiconductor region and the second trench being spaced from each other, and;

a fourth semiconductor region of a second conductive type provided between the first semiconductor region of the first conductive type and the second face, facing the fourth gate electrode, and in contact with the second electrode;

a fifth semiconductor region of a second conductive type provided between the first semiconductor region of the first conductive type and the second face, facing the fifth gate electrode, and in contact with the second electrode;

a sixth semiconductor region of a first conductive type provided between the fourth semiconductor region of the second conductive type and the second face, and in contact with the second electrode; and a seventh semiconductor region of a first conductive type provided between the fifth semiconductor region of the second conductive type and the second face, and in contact with the second electrode.

6. A semiconductor circuit, comprising:

the semiconductor device according to claim 5; and a control circuit for controlling a voltage to be applied to the first electrode pad, the second electrode pad, the third electrode pad, the fourth electrode pad, and the fifth electrode pad.

7. The semiconductor circuit according to claim 6, wherein the control circuit is configured to apply a first turn-on voltage to the first electrode pad, to apply a second turn-on voltage to the third electrode pad, the control circuit is configured to apply a first turn-off voltage to the third electrode pad, after a first predetermined time passes from the application of the first turn-on voltage to the first electrode pad, and the application of the second turn-on voltage to the third electrode pad, the control circuit is configured to apply a voltage to the second electrode pad, after a second predetermined time passes from the application of the first turn-off voltage to the third electrode pad, an accumulation layer is formed in a portion of the second semiconductor region facing the second gate electrode by the application of the voltage to the second electrode pad, the control circuit is configured to apply a third turn-on voltage to the fifth electrode pad, after a third predetermined time passes from the application of the first turn-off voltage to the third electrode pad, and the control circuit is configured to apply a fourth turn-on voltage to the fourth electrode pad, after a fourth predetermined time passes from the application of the third turn-on voltage to the fifth electrode pad.

8. The semiconductor circuit according to claim 7, wherein, the control circuit is configured to apply a second turn-off voltage to the first electrode pad, after a fifth predetermined time passes from the application of the first turn-on voltage to the first electrode pad, the application of the second turn-on voltage to the third electrode pad, the control circuit is configured to apply the voltage to the second electrode pad, after the application of the first turn-off voltage to the third electrode pad and before the application of the second turn-off voltage to the first electrode pad, and the control circuit is configured to apply the third turn-on voltage to the fifth electrode pad, before the application of the second turn-off voltage to the first electrode pad.

* * * * *